United States Patent
Madanbashi et al.

(10) Patent No.: US 9,307,244 B2
(45) Date of Patent: Apr. 5, 2016

(54) DATA STORAGE CONTROLLING DEVICE, DATA READING CONTROLLING DEVICE, AND DATA STORING METHOD

(71) Applicant: MegaChips Corporation, Osaka-shi (JP)

(72) Inventors: Tomoaki Madanbashi, Osaka (JP); Akira Okamoto, Osaka (JP); Hideki Daian, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 201 days.

(21) Appl. No.: 13/951,700

(22) Filed: Jul. 26, 2013

(65) Prior Publication Data

US 2014/0044371 A1 Feb. 13, 2014

(30) Foreign Application Priority Data

Aug. 8, 2012 (JP) .................................. 2012-175815

(51) Int. Cl.
  *G06K 9/36* (2006.01)
  *H04N 19/90* (2014.01)
  *H04N 19/15* (2014.01)
  *H03M 7/30* (2006.01)

(52) U.S. Cl.
  CPC ........... *H04N 19/00945* (2013.01); *H03M 7/30* (2013.01); *H04N 19/15* (2014.11); *H04N 19/90* (2014.11)

(58) Field of Classification Search
  None
  See application file for complete search history.

(56) References Cited

U.S. PATENT DOCUMENTS

| | | | |
|---|---|---|---|
| 2002/0163964 A1* | 11/2002 | Nichols ................ | H04N 1/4147 375/240.03 |
| 2005/0232501 A1* | 10/2005 | Mukerjee ..................... | 382/239 |
| 2007/0110328 A1* | 5/2007 | Okada et al. .................. | 382/251 |
| 2008/0018746 A1* | 1/2008 | Kawanami ............... | 348/207.99 |
| 2009/0067734 A1* | 3/2009 | Kalevo ........................ | 382/238 |
| 2009/0257485 A1 | 10/2009 | Youn | |
| 2011/0142134 A1* | 6/2011 | Wahadaniah et al. .... | 375/240.16 |
| 2011/0206130 A1* | 8/2011 | Koto et al. ............... | 375/240.21 |
| 2014/0341477 A1* | 11/2014 | Giubilato ............... | H04N 5/378 382/232 |

FOREIGN PATENT DOCUMENTS

JP  2009-260977  11/2009

OTHER PUBLICATIONS

U.S. Appl. No. 14/368,112, filed Jun. 23, 2014, Okamoto.

* cited by examiner

*Primary Examiner* — Li Liu
(74) *Attorney, Agent, or Firm* — Oblon, McClelland, Maier & Neustadt, L.L.P.

(57) ABSTRACT

A data storage controlling device has: a compression unit which performs lossless compression on each compression object region; determination means which determines whether or not the lossless compression is possible in each compression determination region including a plurality of compression object regions; and a storage control unit which performs storage control in each compression determination region in such a manner that data after the lossless compression in a compression determination region is stored as compressed data into a storage unit when it is determined that the lossless compression in each compression object region included in the certain compression determination region is possible, and image data before the lossless compression in the certain compression determination region is stored into the storage unit when it is determined that the lossless compression in each compression object region included in the certain compression determination region is impossible.

8 Claims, 16 Drawing Sheets

F I G . 1
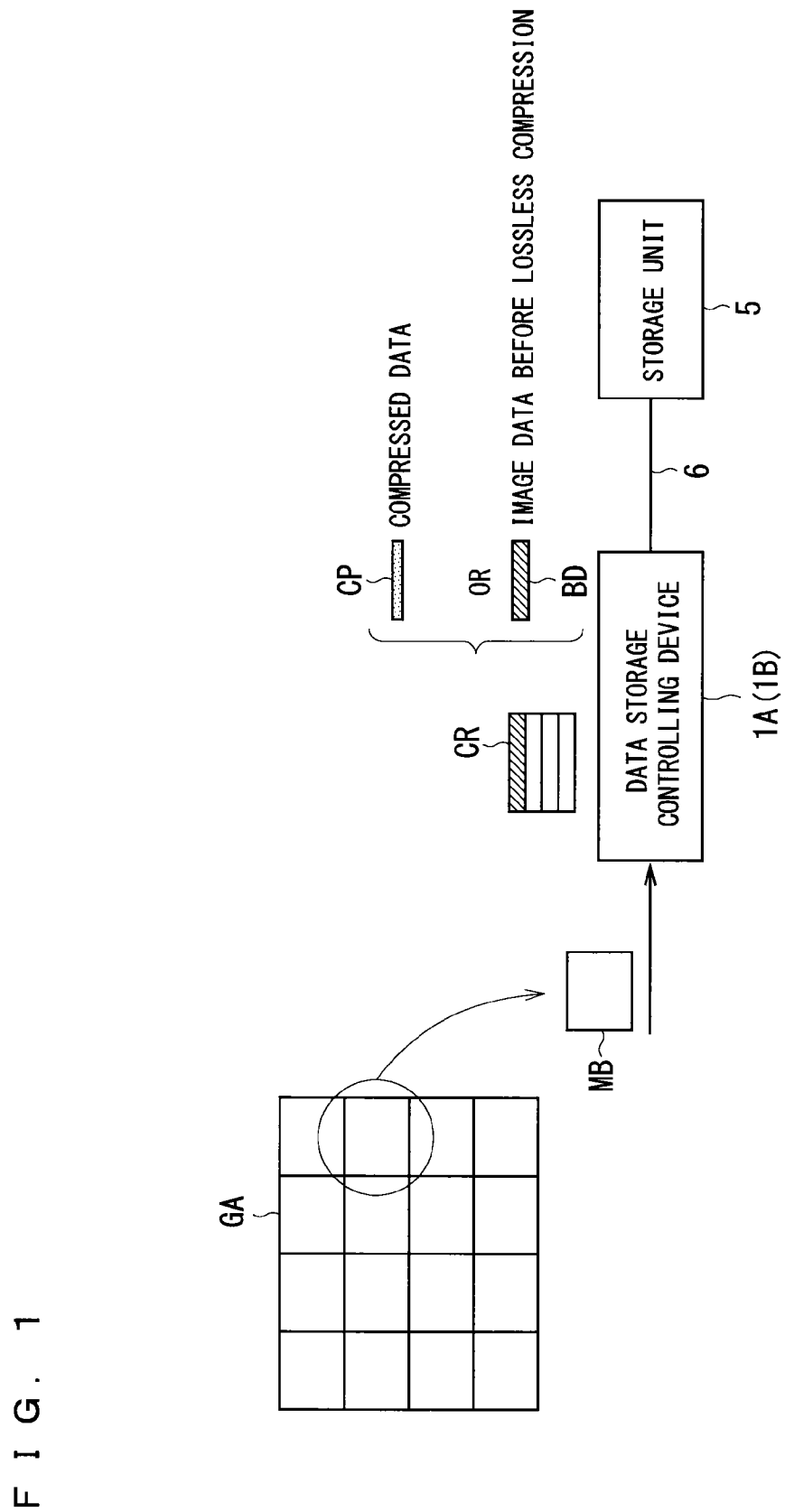

F I G. 7
Y : block 16×4   U : block 8×2   V : block 8×2
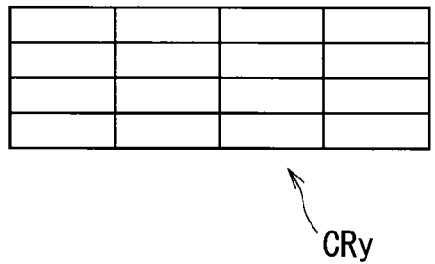
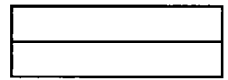
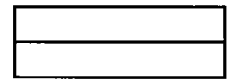

Y

| 114 110 123 137 | 129 125 127 126 | 119 110 103 97 | 94 90 88 85 |
|---|---|---|---|
| 98 101 111 121 | 120 117 117 117 | 114 111 106 99 | 93 89 86 84 |
| 91 96 103 111 | 114 112 111 111 | 109 106 104 101 | 95 91 89 88 |
| 88 93 100 106 | 109 109 108 107 | 105 103 100 98 | 96 92 90 89 |

U

| 157 161 162 161 158 154 152 150 |
|---|
| 151 153 153 153 153 152 150 149 |

V

| 85 79 76 78 81 88 94 99 |
|---|
| 96 92 90 90 90 92 95 99 |

Y

| 114 -4 13 14 | 129 -4 2 -1 | 119 -9 -7 -6 | 94 -4 -2 -3 |
|---|---|---|---|
| 98 3 10 10 | 120 -3 0 0 | 114 -3 -5 -7 | 93 -4 -3 -2 |
| 91 5 7 8 | 114 -2 -1 0 | 109 -3 -2 -3 | 95 -4 -2 -1 |
| 88 5 7 6 | 109 0 -1 -1 | 105 -2 -3 -2 | 96 -4 -2 -1 |

U

| 157 4 1 -1 -3 -4 -2 2 |
|---|
| 151 2 0 0 0 -1 -2 -1 |

V

| 85 -6 -3 2 3 7 6 5 |
|---|
| 96 -4 -2 0 0 2 3 4 |

| 40 | 40 | 39 | 39 | 40 | 40 | 39 | 40 | 39 | 39 | 40 | 39 | 38 | 38 | 38 | 38 |
|----|----|----|----|----|----|----|----|----|----|----|----|----|----|----|----|
| 40 | 40 | 40 | 39 | 39 | 44 | 43 | 42 | 42 | 42 | 41 | 40 | 38 | 39 | 41 | 40 |
| 42 | 41 | 39 | 50 | 66 | 46 | 47 | 42 | 51 | 46 | 44 | 43 | 42 | 39 | 38 | 39 |
| 43 | 42 | 42 | 43 | 43 | 42 | 43 | 43 | 42 | 43 | 44 | 44 | 43 | 50 | 49 | 41 |

U

| 139 | 141 | 140 | 136 | 136 | 135 | 136 | 135 |
|-----|-----|-----|-----|-----|-----|-----|-----|
| 137 | 137 | 136 | 137 | 137 | 136 | 136 | 136 |

V

| 115 | 113 | 111 | 115 | 136 | 119 | 119 | 119 |
|-----|-----|-----|-----|-----|-----|-----|-----|
| 116 | 117 | 118 | 111 | 114 | 118 | 118 | 118 |

⇩

Y

| 40 | 0  | -1 | 0  | 40 | 0   | -1 | 1  | 39 | 0  | 1  | -1 | 38 | 0  | 0  | 0  |
|----|----|----|----|----|-----|----|----|----|----|----|----|----|----|----|----|
| 40 | 0  | 0  | -1 | 39 | 5   | -1 | -1 | 42 | 0  | -1 | -1 | 38 | 1  | 2  | -1 |
| 42 | -1 | -2 | 11 | 66 | -20 | 1  | -5 | 51 | -5 | -2 | -1 | 42 | -3 | -1 | 1  |
| 43 | -1 | 0  | 1  | 43 | -1  | 1  | 0  | 42 | 1  | 1  | 0  | 43 | 7  | -1 | -8 |

Pxx

U

| 139 | 2 | -1 | -4 | 0 | -1 | 1  | -1 |
|-----|---|----|----|---|----|----|----|
| 137 | 0 | -1 | 1  | 0 | -1 | 0  | 0  |

Pyy    Pzz

V

| 115 | -2 | -2 | 4  | 21 | -17 | 0 | 0 |
|-----|----|----|----|----|-----|---|---|
| 116 | 1  | 1  | -7 | 3  | 4   | 0 | 0 |

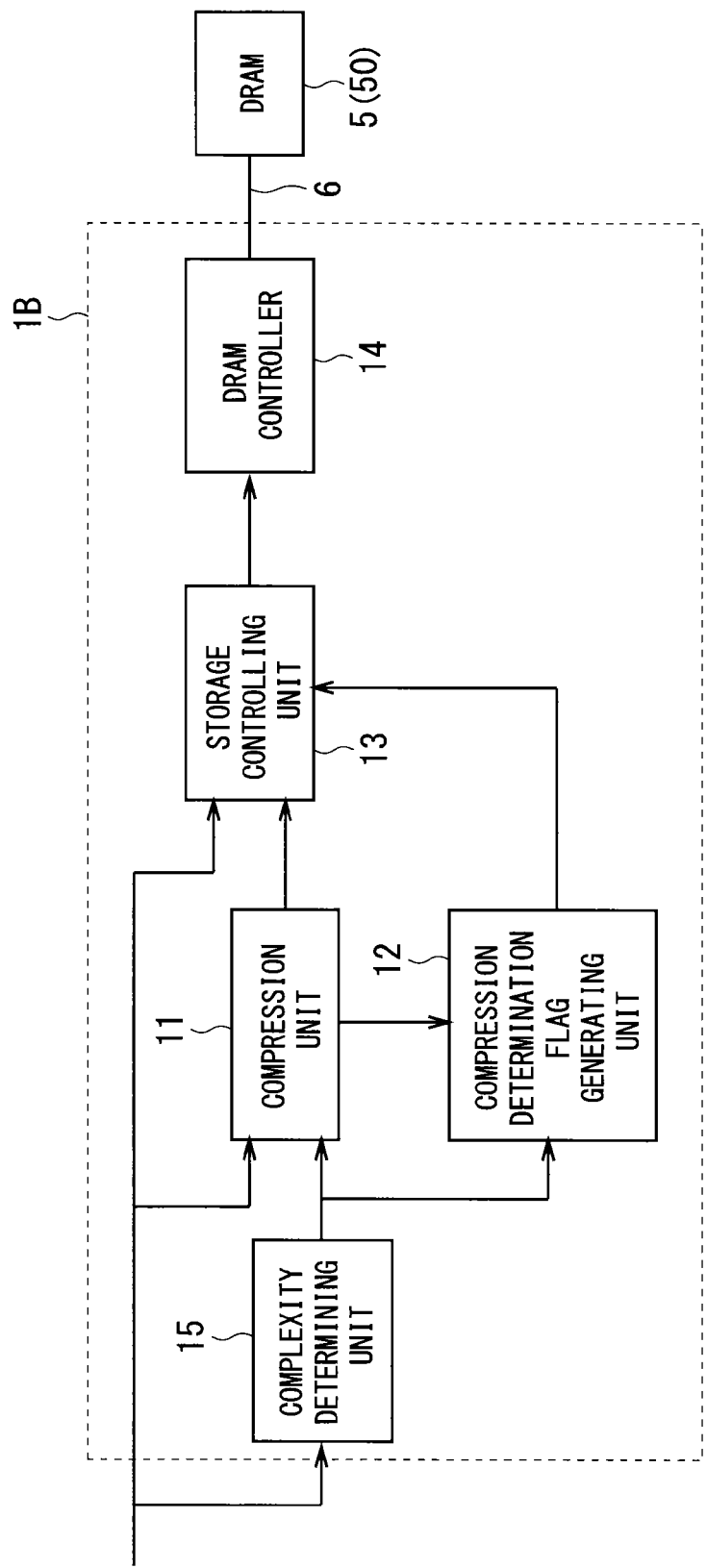

F I G. 1 5
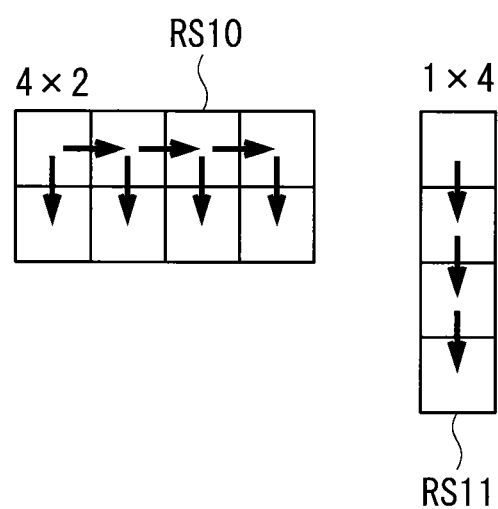

DATA STORAGE CONTROLLING DEVICE, DATA READING CONTROLLING DEVICE, AND DATA STORING METHOD

BACKGROUND OF THE INVENTION

1. Field of the Invention

The present invention relates to a data storing technique.

2. Description of the Background Art

Image data of a still image and a moving image is subjected to the compression process for the purpose of reducing data amounts.

For example, Japanese Patent Application Laid-Open No. 2009-260977 describes a technique of compressing video data into a smaller size by combining lossy compression and lossless compression.

SUMMARY OF THE INVENTION

Although data-degradation-free lossless data can be generated by the lossless compression, it may not necessarily reduce a data amount, and it may conversely increase the data amount.

Accordingly, it is an object of the present invention to provide a technique with a high possibility of reducing a data amount while generating data-degradation-free lossless data.

A first aspect of a data storage controlling device has: a compression unit which performs lossless compression for reducing a data amount on each process region including a plurality of pixels in an image; a determination unit which determines whether or not the lossless compression is possible in each determination region including a plurality of process regions; and a storage controlling unit which performs storage control in each determination region in such a manner that data after the lossless compression in a certain determination region is stored as compressed data into a storage unit when the lossless compression in each process region included in the certain determination region is determined as possible, and image data before the lossless compression in a certain determination region is stored into the storage unit when the lossless compression in each process region included in the certain determination region is determined as impossible.

A second aspect of the data storage controlling device is the first aspect, wherein each image data in units of blocks obtained by dividing the image is sequentially inputted into the compression unit in units of lines, and the compression unit performs the lossless compression on each sequentially inputted image data in units of blocks in each process region.

A third aspect of the data storage controlling device is the first aspect or the second aspect, further having a complexity determining unit which determines complexity of the image to decide a compression condition for the lossless compression, wherein the compression unit performs the lossless compression based on the compression condition decided in accordance with the complexity.

A fourth aspect of the data storage controlling device is any one of the first to third aspects, wherein the storage controlling unit gets stored the compressed data and the image data before the lossless compression, such that start addresses showing a storage locations of the compressed data and the image data before the lossless compression are provided at regular intervals with respect to respective determination regions.

A fifth aspect of the data storage controlling device is any one of the first to fourth aspects, wherein the compression unit sets a reference pixel out of a plurality of pixels included in the process region, calculates a difference in pixel value from an adjacent pixel with respect to each normal pixel except for the reference pixel in the process region such that a pixel value of each normal pixel is specified from a pixel value of the reference pixel, and expresses the difference in pixel value calculated with respect to each normal pixel by the number of bits which is smaller than the number of bits expressing the pixel value of the reference pixel, to convert the data amount.

A sixth aspect of the data storage controlling device is the fifth aspect, wherein the determination unit determines that lossless compression in the determination region is possible when the difference in pixel value at each normal pixel in each process region included in the determination region can all be expressed by the number of bits which is smaller.

A seventh aspect of the data storage controlling device is any one of the first to sixth aspects, wherein each image data in units of blocks obtained by dividing the image is sequentially inputted into the compression unit every other line, and the compression unit sets the process region so as to include a plurality of pixels on the same line, to perform the lossless compression on the process region.

An aspect of a data reading controlling device is a data reading controlling device capable of reading storage data from a storage unit for storing, as the storage data, either compressed data concerning image data in a determined region of an image, the image data being stored when lossless compression of the image data in the determined region is possible or the image data in the determined region, the image data being stored when the lossless compression is impossible, and a compression determination flag indicating whether or not the lossless compression has been possible, the device having: a reading unit which reads the storage data; an extension unit which can extend the compressed data included in the storage data; and a selection unit which outputs data after extension by the extension unit when the compression determination flag indicating that the lossless compression of the image data in the determined region has been possible is included in the storage data, and outputs the image data in the determined region included in the storage data when the compression determination flag indicating that the lossless compression of the image data in the determined region has been impossible is included in the storage data.

An aspect of a data storing method has the steps of: a) performing lossless compression for reducing a data amount in each process region including a plurality of pixels in an image; b) determining whether or not the lossless compression is possible in each determination region including a plurality of process regions; and c) storing, as compressed data, data after the lossless compression in a certain determination region into the storage unit when it is determined that the lossless compression is possible concerning the certain determination region, and storing image data before the lossless compression in the certain determination region into the storage unit when it is determined that the lossless compression is impossible concerning the certain determination region.

There thus is a high possibility of reducing a data amount while generating data-degradation-free lossless data.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram showing an operational overview of a data storage controlling device according to a first preferred embodiment;

FIG. 7 is a diagram showing compression object regions set in a compression determination region;

FIGS. 8 and 9 are diagrams showing examples of a pixel value of each pixel included in the compression determination region;

FIG. 14 is a block diagram showing a configuration of a data storage controlling device according to a second preferred embodiment;

FIG. 15 is a diagram showing another aspect of the compression object region.

DESCRIPTION OF THE PREFERRED EMBODIMENTS

Figure 2:
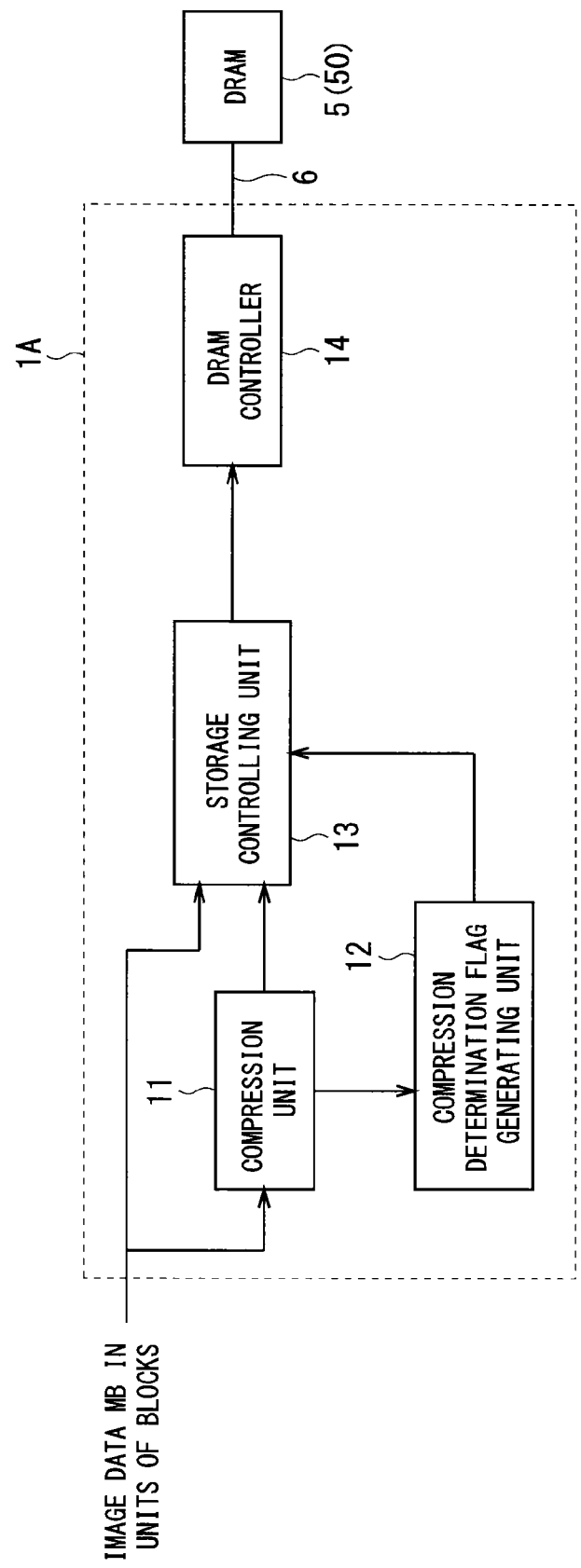
FIG. 2 is a block diagram showing a configuration of the data storage controlling device according to the first preferred embodiment.

Hereinafter, each preferred embodiment will be described with reference to the drawings. It is to be noted that an element provided with the same numeral in different drawings shows the same or a corresponding element.

1. First Preferred Embodiment

[1-1. Overview]

FIG. 1 is a diagram showing an operational overview of a data storage controlling device 1A according to a first preferred embodiment.

As shown in FIG. 1, image data (also referred to as "block image data") in units of blocks, obtained by dividing an entire image GA into a plurality of blocks, are sequentially inputted into the data storage controlling device 1A by units of lines. In the data storage controlling device 1A, predetermined lossless compression is performed on block image data MB as pieces of original image data that are sequentially inputted in units of lines.

The predetermined lossless compression is performed with respect to a plurality of regions (also referred to as "compression object region" or "compression processing region") obtained by sectioning a block image. The predetermined lossless compression is processing capable of reliably reducing a data amount, but there are cases where the lossless compression cannot be performed depending on the compression object region.

Accordingly, the data storage controlling device 1A determines whether or not the lossless compression is possible in each predetermined region CR including a plurality of compression object regions, namely whether or not the image data before the lossless compression can be restored from data after the lossless compression, and controls data to be stored into a storage unit 5 in accordance with a result of the determination. Since the predetermined region CR is a region used at the time of determining the success or failure of the lossless compression, it is also referred to as a "compression determination region"

Specifically, when the lossless compression is possible in the compression determination region CR including a plurality of compression object regions, the data storage controlling device 1A outputs compressed data CP after the lossless compression, and stores it into the storage unit 5. On the other hand, when the lossless compression is impossible in the compression determination region CR, the data storage controlling device 1A outputs image data BD before the lossless compression concerning the compression determination region CR, and stores it into the storage unit 5.

As thus described, in the data storage controlling device 1A, since the compressed data CP with a reduced amount is stored into the storage unit 5 as to the lossless-compressible compression determination region CR, data concerning the image GA can be stored in a reduced amount into the storage unit 5. For this reason, at the time of reading and writing the data concerning the image GA, it is possible to reduce an amount of a bus used, so as to reduce the time required for data transfer.

Moreover, as described above, in the data storage controlling device 1A, the compressed data CP with a reduced amount is stored into the storage unit 5 as to the lossless-compressible compression determination region CR, and the original image data BD before the lossless compression is stored into the storage unit 5 as to the lossless-incompressible compression determination region CR. By use of the data storage controlling device 1A as thus described, it is possible to store degradation-free lossless data into the storage unit 5, and completely restore the original image GA from the data stored in the storage unit 5.

[1-2. Configuration of Data Storage Controlling Device]

Next, a configuration of the data storage controlling device 1A will be described. FIG. 2 is a block diagram showing a configuration of the data storage controlling device 1A according to the preferred embodiment.

As shown in FIG. 2, the data storage controlling device 1A is electrically connected to a DRAM 50 as the storage unit 5 via a bus 6.

The data storage controlling device 1A is provided with a compression unit 11, a compression determination flag generating unit 12, a storage control unit 13 and a DRAM controller 14, and the block image data MB inputted into the data storage controlling device 1A is inputted into the compression unit 11 and the storage control unit 13.

The compression unit 11 performs predetermined lossless compression on the block image data MB in each compression object region. Moreover, the compression unit 11 also has a function as determination means for determining whether or not the lossless compression is possible in the compression determination region including a plurality of compression object regions. The compression unit 11 outputs to the storage control unit 13 data after the lossless compression concerning each compression determination region as compressed data, while outputting to the compression determination flag generating unit 12 a result of determination as to whether or not the lossless compression of the compression determination region has been possible.

The compression determination flag generating unit 12 generates a compression determination flag based on the determination result inputted from the compression unit 11. Specifically, when inputted with a determination result showing that the lossless compression has been possible, the compression determination flag generating unit 12 generates "1" as the compression determination flag and outputs the compression determination flag to the storage control unit 13. On the other hand, when inputted with a determination result showing that the lossless compression has been impossible, the compression determination flag generating unit 12 generates "0" as the compression determination flag and outputs the compression determination flag to the storage control unit 13.

Based on the compression determination flag inputted from the compression determination flag generating unit 12, the storage control unit 13 selects and outputs either one data out of the image data BD before the lossless compression concerning the compression determination region CR and the compressed data CP after the lossless compression concerning the compression determination region CR. Specifically, when inputted with the determination flag "1" indicating that the lossless compression has been possible, the storage control unit 13 outputs to the DRAM controller 14 the compressed data CP after the lossless compression concerning the compression determination region CR. On the other hand, when inputted with the determination flag "0" indicating that the lossless compression has been impossible, the storage control unit 13 outputs to the DRAM controller 14 the image data BD before the lossless compression concerning the compression determination region CR.

Moreover, the storage control unit 13 also has a function as an address generating unit for generating an address (writing address) indicating a storage location in the storage unit 5 for the output data (the compressed data CP or the image data BD before the lossless compression). That is, the storage control unit 13 generates the writing addresses for the compressed data CP and the image data BD before the lossless compression, and outputs them to the DRAM controller 14.

The DRAM controller 14 stores the output data, outputted from the storage control unit 13, into the storage location in a DRAM 50 designated by the writing address.

[1-3. Operation of Data Storage Controlling Device]

Figure 3:
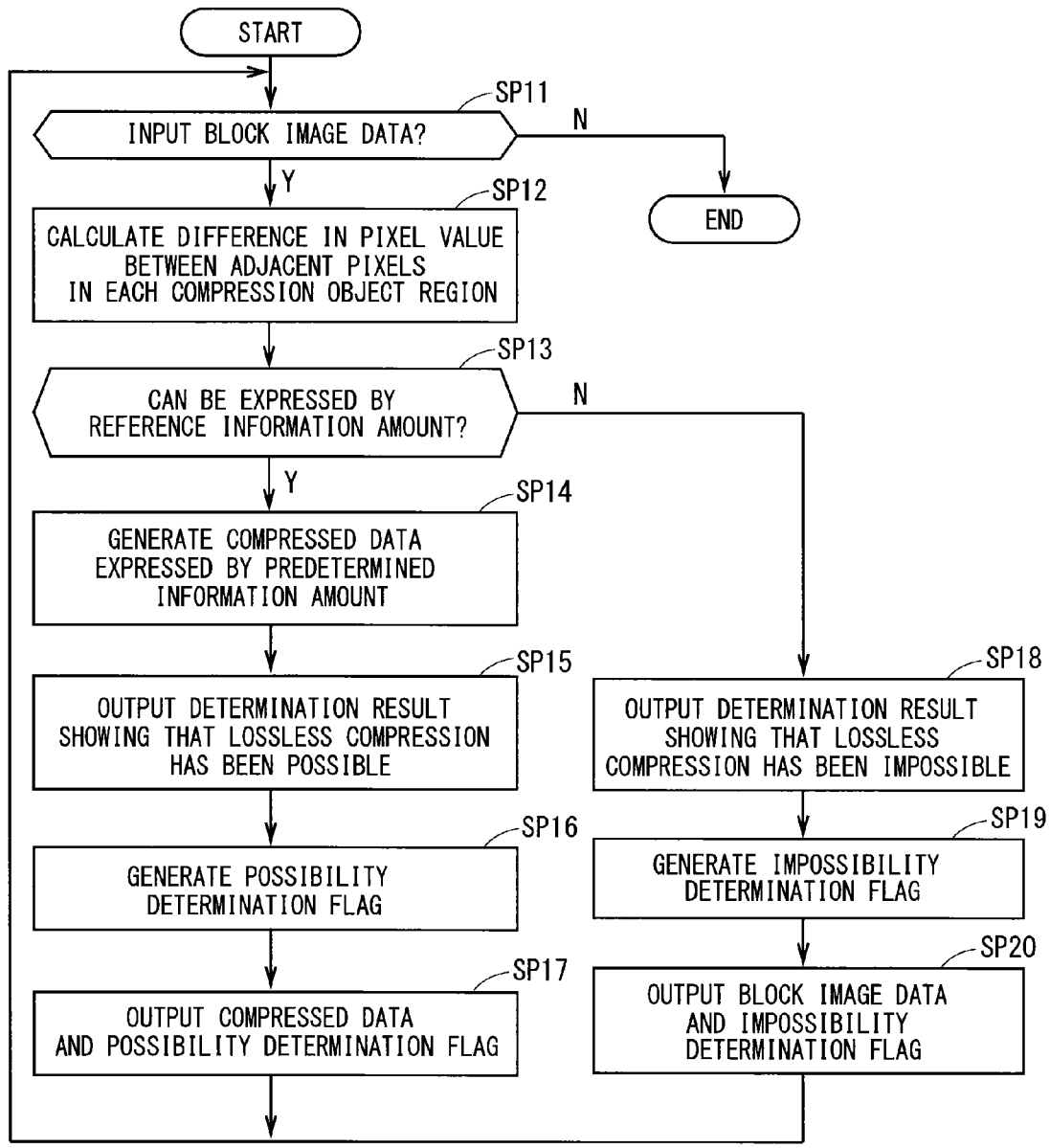
FIG. 3 is a flowchart of an operation of the data storage controlling device.
Figure 4:
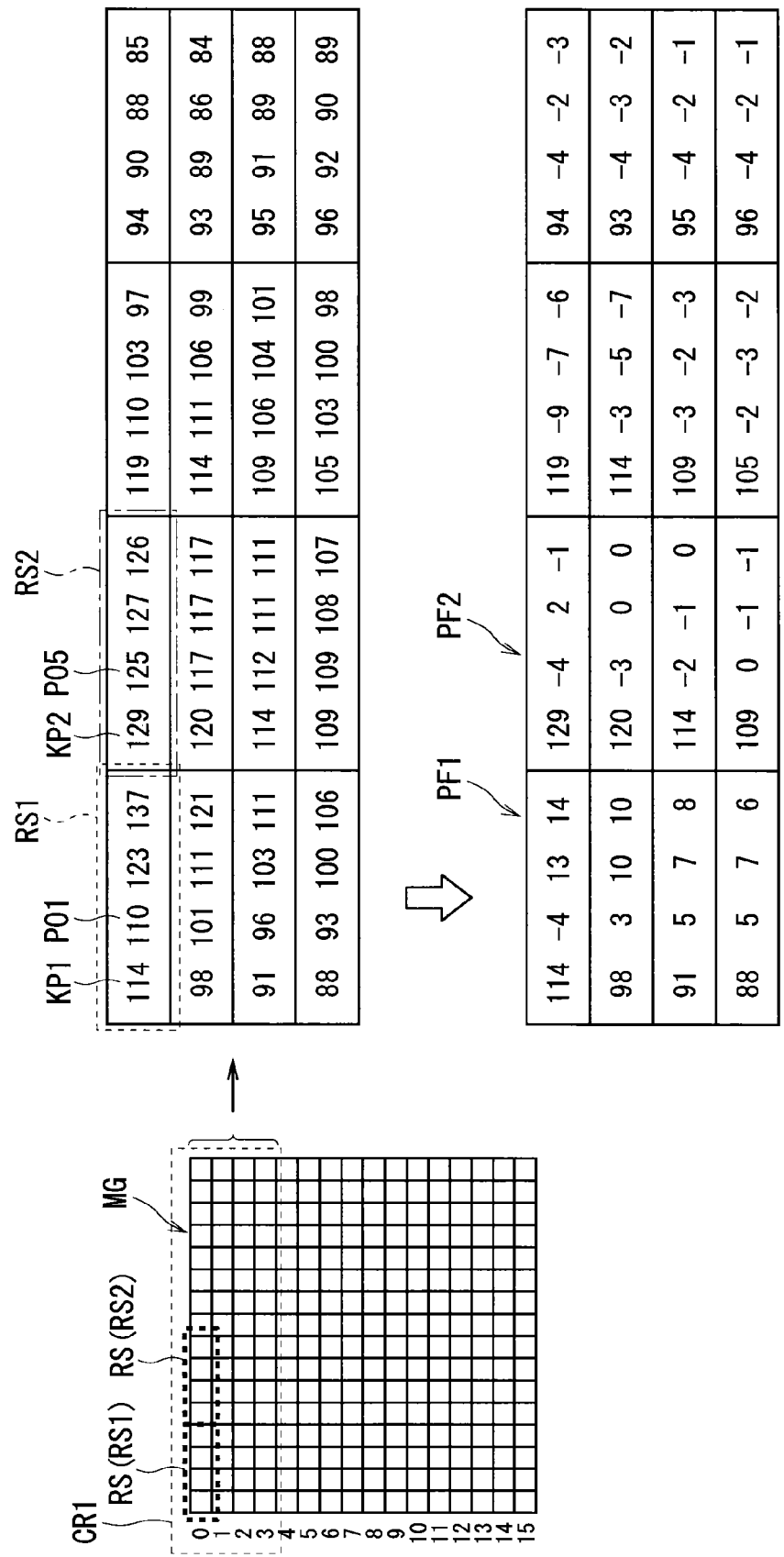
FIGS. 4 and 5 are diagrams for explaining a lossless compression technique.
Figure 5:

Next, an operation of the data storage controlling device 1A will be described. FIG. 3 is a flowchart of the operation of the data storage controlling device 1A. FIGS. 4 and 5 are diagrams for explaining a lossless compression technique. It should be noted that the pixel value of each pixel is expressed by 8 bits in FIGS. 4 and 5.

As shown in FIG. 3, in Step SP11, the data storage controlling device 1A determines whether or not the block image data MB has been inputted. When the block image data MB has been inputted, the operating process is shifted to Step SP12, and when the block image data MB has not been inputted, the operating process is completed.

Respective processes in subsequent Steps SP 12 to SP17 are processes executed in the compression unit 11, where predetermined lossless compression is performed on the inputted block image data MB in each compression object region.

As the lossless compression technique, for example, there can be adopted a technique in which a reference pixel is set in each compression object region RS having a size of 4×1 pixels, and while a pixel value of the reference pixel is held, pixel value information of each of pixels (normal pixels) except for the reference pixel is expressed based on a difference in pixel value between pixels which are adjacent with each other in a certain direction.

Here, a description will be provided, taking as an example a case where inputted block image data MB is image data concerning block image MG of 16×16 pixels, as shown in FIG. 4. It is to be noted that in FIG. 4, a pixel value of each pixel from zeroth to third lines in the block image data MG is shown.

In Step SP12, a difference in pixel value between pixels which are adjacent with each other is calculated in each compression object region RS in the block image data MG.

Specifically, a difference in pixel value from a pixel on the immediate left is calculated at each pixel in each compression object region RS. The calculated difference becomes pixel value information concerning a pixel value of each pixel. For example, as shown in FIG. 4, when the pixel value of the reference pixel KP1 in the compression object region RS1 is "114" and the pixel value of the pixel P01 on the immediate right of the reference pixel KP1 is "110", pixel value information in the pixel P01 is "−4" obtained by subtracting the pixel value of the reference pixel KP1 from the pixel value of the pixel P01. In this manner, a difference in pixel value from a pixel on the immediate left is sequentially calculated, to acquire pixel value information PF1 with respect to each pixel in the compression object region RS1.

Thereafter, pixel value information concerning each pixel in a compression object region RS2 is acquired. When a pixel value of a reference pixel KP2 in a compression object region RS2 is "129" and a pixel value of a pixel P05 on the immediate right of the reference pixel KP2 is "125", pixel value information in the pixel P05 is "−4" obtained by subtracting the pixel value of the reference pixel KP2 from the pixel value of the pixel P05. In this manner, a difference in pixel value from the pixel on the immediate left is sequentially calculated, to acquire pixel value information PF2 concerning each pixel in the compression object region RS2.

As described above, in Step SP12, a difference in pixel value from an adjacent pixel is calculated with respect to each normal pixel except for the reference pixel in each compression object region RS in the block image MG, to acquire pixel value information of each pixel.

By use of the pixel value information of each pixel, a pixel value of each normal pixel can be specified from the pixel value of the reference pixel, and hence a difference in pixel value from an adjacent pixel, calculated with respect to each normal pixel, can also be expressed as a difference calculated so as to specify a pixel value of each normal pixel from the pixel value of the reference pixel.

It is to be noted that the pixel value information in the compression object region can also be expressed as being obtained by regarding one pixel located in a corner of the compression object region as a reference pixel and calculating a difference in pixel value between pixels which are adjacent with each other with respect to normal pixels except for the reference pixel.

In subsequent Step SP13, it is determined whether or not any pixel value information of each pixel except for the reference pixel can be expressed by a determined information amount in each compression determination region. The determined information amount is a previously determined capacity (also referred to as "pixel expression capacity") for expressing pixel value information, and is set to be a smaller number of bits than the number of bits which expresses the pixel value of the reference pixel, namely the pixel value of the original image data. Since the case where the pixel value of the pixel in the block image MG is expressed by 8 bits has been exemplified here, the determined information amount is set, for example, to be 4 bits, 5 bits, 6 bits or the like.

Specifically, when the expression capacity is set to 5 bits, it is determined in Step S13 whether or not the pixel value information of each normal pixel except for the reference pixel can be expressed by 5 bits in each compression determination region. Whether or not it can be expressed by 5 bits can be determined based on whether or not the pixel value information is included in a range of numeric values which can be expressed by 5 bits (namely, −16 to +15). It should be noted that here, pixel value information of a negative number is expressed using a complement number of 2.

For example, as shown in FIG. 4, when a region including 16 compression object regions RS, set on the zeroth line through the third line in the block image MG, is regarded as a compression object region CR1, pixel value information of each normal pixel included in the compression determination region CR1 can all be expressed by 5 bits. Hence it is determined that the pixel value information of each normal pixel included in the compression determination region CR1 can be expressed by 5 bits.

As opposed to this, when a pixel value of each pixel included in a compression determination region CR2 in a certain block image is a pixel value shown in FIG. 5, pixel value information "−20" concerning a pixel Pxx cannot be expressed by 5 bits. Hence it is determined that the pixel value information of each normal pixel included in the compression determination region CR2 cannot be expressed by 5 bits.

When it is determined in Step SP13 that the pixel value information of each pixel included in the compression determination region can be expressed by the determined information amount, the operating process is shifted to Step SP14. On the other hand, when it is determined that the pixel value information of each pixel included in the compression determination region cannot be expressed by the determined information amount, the operating process is shifted to Step SP16.

In Step SP 14, the pixel value information included in the compression determination region, which has been determined as expressible by the determined information amount, is expressed by the determined information amount, thereby generating the compressed data CP concerning the compression determination region.

Specifically, when the determined information amount is 5 bits, a cardinal number of the pixel value information calculated as a difference in pixel value between pixels which are adjacent with each other is converted, and expressed by 5 bits, using a complement number of 2. This leads to generation of the compressed data CP where the pixel value information of each pixel except for the reference pixel is expressed by 5 bits. As thus described, when the determined information amount is 5 bits, the pixel value of each normal pixel having been expressed by 8 bits comes to be expressed by 5 bits, thereby allowing reduction in data amount.

Although the case where the determined information amount for expressing pixel value information is 5 bits has been exemplified here, a compression rate can be changed when the determined information amount is changed.

For example, when the determined information amount is set to be 4 bits, the pixel value of each pixel which has been expressed by 8 bits comes to be expressed by 4 bits, and hence the data amount is reduced to about one half.

Further, when the determined information amount is set to be 6 bits, the pixel value of each pixel which has been expressed by 8 bits comes to be expressed by 6 bits, and hence the data amount is reduced to about three-fourths.

As thus described, the compression unit 11 has calculation means for calculating a difference in pixel value between pixels which are adjacent with each other and are included in a compression object region, to acquire pixel value information, and conversion means for expressing the difference, which has been calculated by the calculation means, by a smaller number of bits than the number of bits which expresses the pixel value of the reference pixel, to convert a data amount and generates compressed data CP in each compression determination region. The compressed data CP in each compression determination region, which has been generated by the compression unit 11, is then outputted to the storage control unit 13.

It is to be noted that the compressed data CP outputted from the compression unit 11 includes a direction flag indicating a direction in which the difference in pixel value is calculated at the time of generating the compressed data CP. The direction flag is used at the time of extending the compressed data CP.

In subsequent Step SP15, a determination result showing that the lossless compression has been possible is outputted from the compression unit 11 to the compression determination flag generating unit 12.

In Step S16, a compression determination flag (compression possible flag) "1" indicating that the lossless compression has been possible is generated in the compression determination flag generating unit 12, and it is outputted to the storage control unit 13.

Then, in Step SP17, the storage control unit 13 outputs to the DRAM controller 14 the compressed data CP and the compression determination flag concerning the compression determination region. Further, the storage control unit 13 also generates and outputs a writing address showing a storage location in the DRAM 50 for the compressed data CP and the compression determination flag.

Moreover, when the process is shifted from Step SP13 to Step SP18, a determination result showing that the lossless compression has been impossible is outputted from the compression unit 11 to the compression determination flag generating unit 12 in Step SP18.

In subsequent Step SP19, a compression determination flag (compression impossible flag) "0" indicating that the lossless compression has been impossible is generated in the compression determination flag generating unit 12, and the compression determination flag is outputted to the storage control unit 13.

In Step SP20, the storage control unit 13 outputs to the DRAM controller 14 the image data BD before the lossless compression and the impossibility determination flag concerning the compression determination region. Moreover, the storage control unit 13 also generates and outputs a writing address showing a storage location in the DRAM 50 for the image data BD before the lossless compression and the impossibility determination flag concerning the compression determination region.

It should be noted that the size of the compression determination region is preferably set such that the data amount of the image data included in the compression determination region is not larger than a data amount transferable by DMA transfer at one time, and when the size of the compression determination region is decided so as to satisfy such a setting standard, it is possible to sequentially perform a compression process on image data which is to be inputted into the data storage controlling device 1A by the DMA transfer.

In addition, the pixel value used in the foregoing description of the lossless compression corresponds to a value of a luminance signal when the image GA is a black-and-white image, and the pixel value corresponds to a luminance signal Y and color signals concerning colors when the image GA is a color image.

Figure 6:
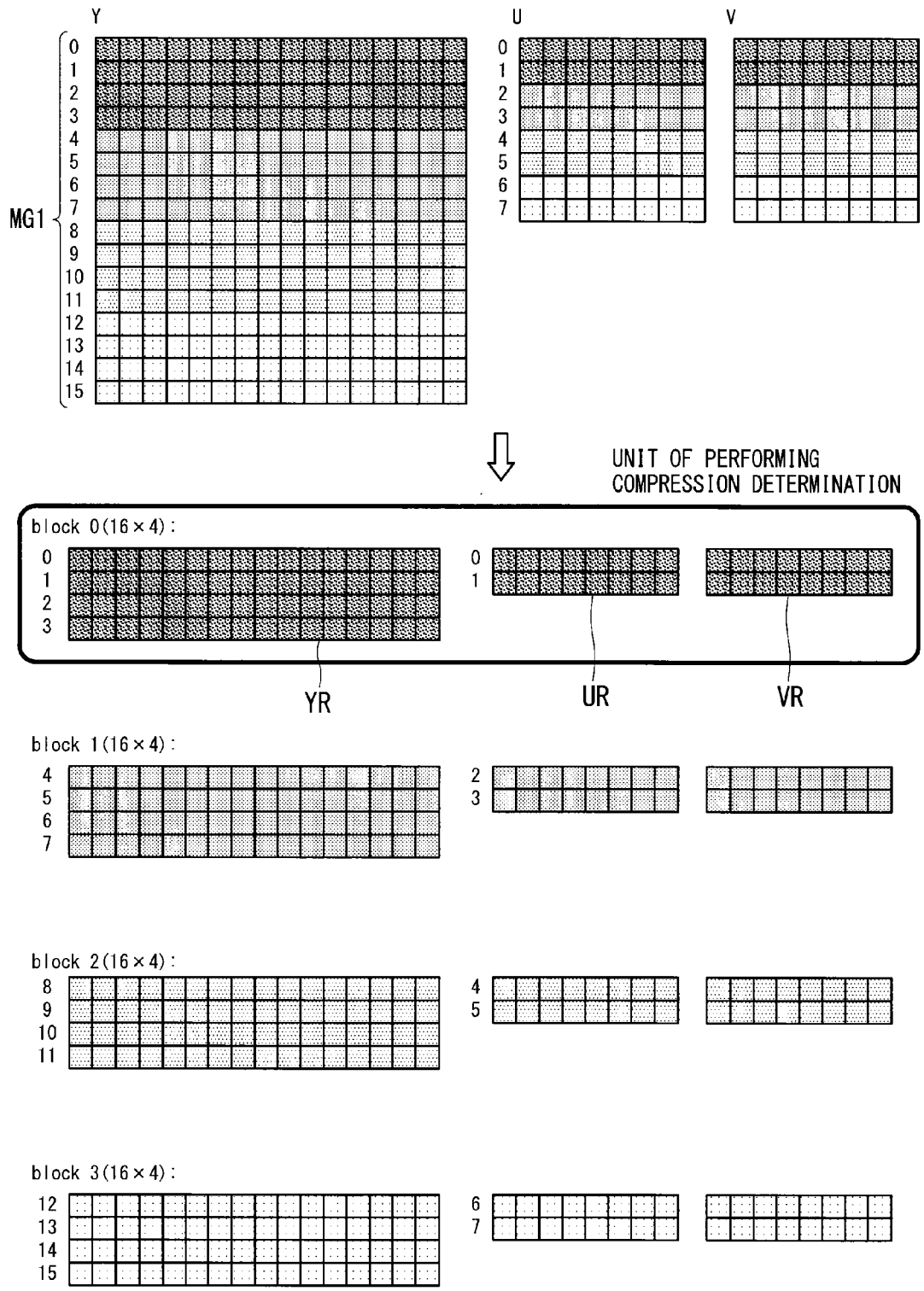
FIG. 6 is a schematic diagram of compression processing which is performed on a block image in YUV420 format.

For example, on a color image expressed in YUV format, the luminance signal Y and two color-difference signals U and V are used as pixel values, and the compression process is performed on each of the values Y, U and V. FIG. 6 is a schematic diagram of a compression process which is performed on a block image MG1 in YUV420 format.

As shown in FIG. 6, the block image MG1 of 16×16 pixels obtained by dividing the color image in YUV 420 format has the luminance signals Y of 16×16 pixels, the color-difference signal U of 8×8 pixels and the color-difference signal V of 8×8 pixels.

When a region of 16×4 pixels in the block image MG1 as thus described is regarded as the compression determination region, a region YR of 16×4 pixels becomes a compression determination object as to the luminance signal Y, and regions UR and VR of 8×2 pixels each become compression determination objects as to the two color-difference signals U and V. That is, the compression determination is performed based on whether or not pixel value information of the respective normal pixels included in the region YR concerning the luminance signal Y and the regions UR and VR concerning the color-difference signals U and V can all be expressed by the determined information amount.

Figure 8:

Here, the compression process on the block image MG1 will be described in more detail. FIG. 7 is a diagram showing the compression object regions set in the compression determination region. FIGS. 8 and 9 are diagrams showing examples of a pixel value of each pixel included in the compression determination region.

When the region having a size of 4×1 pixels is regarded as the compression object region as to the luminance signal Y and the region having a size of 8×1 pixels is regarded as the compression object region as to each of the color-difference signals U and V, as shown in FIG. 7, a compression determination region CRy concerning the luminance signal Y includes 16 compression object regions, and compression determination regions CRu and CRv concerning the color-difference signals U and V each include two compression object regions.

In foregoing Steps SP12, the data storage controlling device 1A calculates a difference in pixel value between adjacent pixels in each compression object region concerning the luminance signal Y and the color-difference signals U and V, respectively. In subsequent step SP13, it is determined whether or not any pixel value information of each normal pixel except for the reference pixel can be expressed by the determined information amount in each compression determination region.

For example, when the pixel value of each pixel included in the compression determination region in the block image MG1 in YUV420 format is a pixel value shown in FIG. 8, the pixel value information of each normal pixel included in the compression determination region can all be expressed by 5 bits. Hence it is determined that the pixel value information of each normal pixel included in the compression determination region can be expressed by 5 bits.

As opposed to this, when a pixel value of each pixel included in the compression determination region in the block image MG1 is a pixel value shown in FIG. 9, pixel value information "−20" of a pixel Pxx concerning the luminance signal Y cannot be expressed by 5 bits. Moreover, pixel value information "21" of a pixel Pyy concerning the color-difference signal V and pixel value information "−17" of a pixel Pzz cannot be expressed by 5 bits. Hence it is determined that the pixel value information of each normal pixel included in the compression determination region cannot be expressed by 5 bits.

As thus described, a difference in pixel value between adjacent pixels in each compression object region is calculated for each component with respect to the block image MG1 in YUV format. Then, the success or failure of the lossless compression is determined based on whether or not the pixel value information of each normal pixel included in the region as the compression determination object can all be expressed by the determined information amount.

Moreover, since a change between pixels is relatively small in each of the color-difference signals U and V as compared with in the luminance signal Y, the determined information amount for expressing the pixel value information concerning each of the color-difference signals U and V may be made smaller than the determined information amount for expressing the pixel value information concerning the luminance signal Y. That is, for example, the pixel value information may be expressed by 5 bits as to the luminance signal, and the pixel value information may be expressed by 4 bits as to the color-difference signals. This allows further reduction in data amount of compressed data in accordance with characteristics of the signals.

[1-4. About Storage Control]

Figure 10:
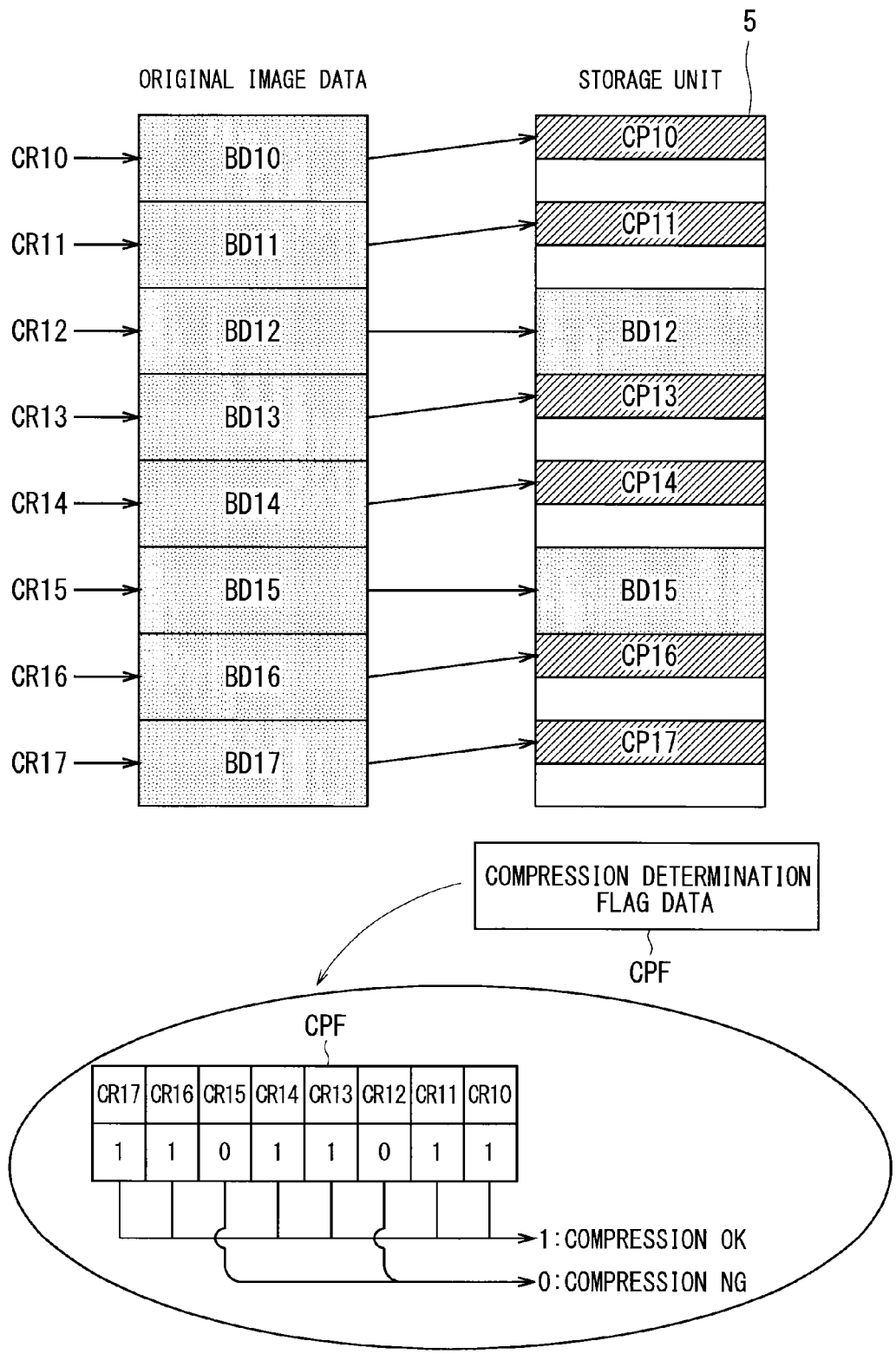
FIG. 10 is a diagram showing a data storage aspect in a storage unit.

Next, a storage control process that is executed in the storage control unit 13 will be detailed. FIG. 10 is a diagram showing a data storage aspect in the storage unit 5.

When inputted with the determination flag "1" indicating that the lossless compression has been possible, the storage control unit 13 outputs to the DRAM controller 14 the compressed data CP after the lossless compression concerning the compression determination region. On the other hand, when inputted with the determination flag "0" indicating that the lossless compression has been impossible, the storage control unit 13 outputs to the DRAM controller 14 the image data BD before the lossless compression concerning the compression determination region.

For example, as shown in FIG. 10, a case is assumed where image data BD12 and BD15 are lossless-incompressible image data out of respective pieces of image data BD10 to BD17 of respective compression determination regions CR10 to CR17.

In this case, as to the lossless-compressible image data BD10, BD11, BD13, BD14, BD16 and BD17, the storage control unit 13 stores into the storage unit 5 the corresponding compressed data CP10, CP11, CP13, CP14, CP16 and CP17.

As opposed to this, as to the lossless-compressible image data BD12 and BD15, the storage control unit 13 stores into the storage unit 5 the image data BD12 and BD15 before the lossless compression.

Moreover, the storage control unit 13 allocates a storage region of the same size to each compression determination region and stores the data thereinto.

Specifically, the storage control unit 13 allocates a storage region capable of storing the image data before the lossless compression in the compression determination region as the storage region for storing data of each compression determination region, and stores the compressed data or the image data before the lossless compression thereinto.

By performing the storage control as thus described, a start address of the storage region to store data concerning each compression determination region becomes an address provided at the same (regular) intervals concerning each compression determination region, thereby facilitating specification of the start address of each data and facilitating specification of an address at the time of writing and reading. That is, address management is facilitated.

Since the compression determination flag is one-bit data indicating whether or not it has been possible to perform the lossless compression on the image data in the compression determination region, the compression determination flag is stored into the storage unit 5 in units of compression determination regions. As the storage aspect of the compression determination flag, for example as shown in FIG. 10, the compression determination flag in each compression determination region may put together and made to be stored as compression determination flag data CPF into the storage unit 5.

As thus described, by getting the compression determination flag stored, it is possible to specify from the data stored in the storage unit 5 as to which data is the compressed data CP or the non-compressed data out of each data stored in the storage unit 5. The compression determination flag is used at the time of restoring the image GA from the data stored in the storage unit 5.

As described above, the data storage controlling device 1A of the first preferred embodiment is provided with: the compression unit 11 which performs lossless compression for reducing a data amount in each compression object region including a plurality of pixels in an image; the determination means which determines whether or not the lossless compression is possible in each compression determination region including a plurality of compression object regions; and the storage control unit 13 which performs storage control in each compression determination region in such a manner that data after the lossless compression in a compression determination region is stored as compressed data into the storage unit 5 when it is determined that the lossless compression in each compression object region included in the certain compression determination region is possible, and image data before the lossless compression in the certain compression determination region is stored into the storage unit 5 when it is determined that the lossless compression in each compression object region included in the certain compression determination region is impossible.

According to the data storage controlling device 1A as thus described, the compressed data is stored into the storage unit 5 when the lossless compression of image data in the compression determination region is possible, and image data before the lossless compression in the compression determination region is stored into the storage unit 5 when the lossless compression of the image data in the compression determination region is impossible, thereby increasing the possibility for reducing the data amount while generating lossless data having no data degradation.

Moreover, as in the data storage controlling device 1A, performing the lossless compression in each compression object region including a plurality of pixels in the image can narrow the object range for single lossless compression, thereby increasing the success rate for the lossless compression and increasing the compression rate of data in the image as a whole.

[1-5. About Data Reading Controlling Device]

Figure 11:
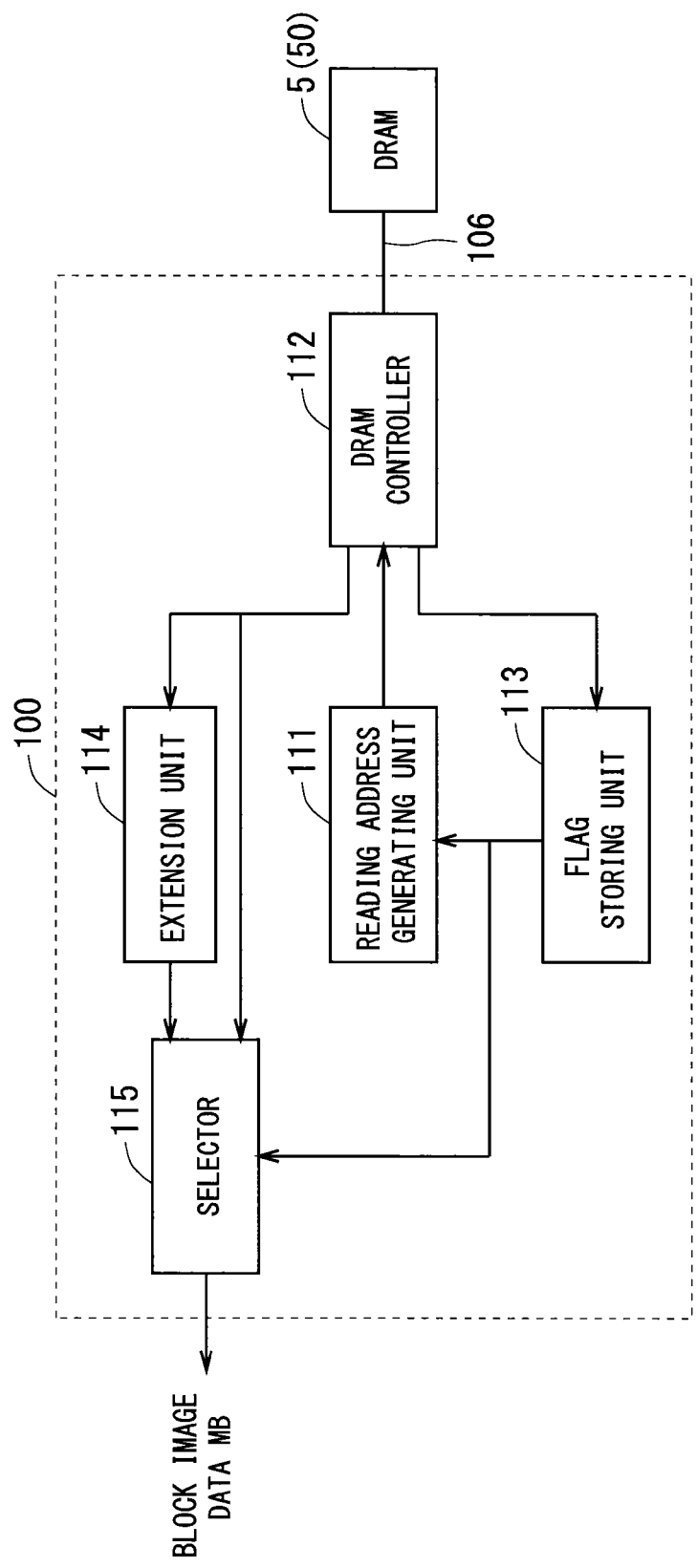
FIG. 11 is a block diagram showing a configuration of a data reading controlling device.

Next described will be a data storage controlling device for reading data stored in the storage unit 5 by means of the foregoing data storage controlling device 1A. FIG. 11 is a block diagram showing a configuration of the data reading controlling device 100 according to the preferred embodiment.

As shown in FIG. 11, the data reading controlling device 100 is electrically connected to the DRAM 50 as the storage unit 5 via a bus 106.

The data reading controlling device 100 is provided with a reading address generating unit 111, a DRAM controller 112, a flag storing unit 113, an extension unit 114 and a selector (selecting means) 115. The data reading controlling device 100 restores the block image data MB from the data (storage data) stored in the DRAM 50 and outputs the block image data MB.

The reading address generating unit 111 generates an address (reading address) indicating a storage location of data as a reading object out of the data stored in the DRAM 50, and outputs the address to the DRAM controller 112.

The DRAM controller 112 makes DRAM 50 output data stored into the storage location designated by the reading address. Moreover, when the DRAM controller 112 reads the compression determination flag data CPF from the DRAM 50, the DRAM controller 112 outputs the compression determination flag data CPF to the flag storing unit 113. Furthermore, when the DRAM controller 112 reads from the DRAM 50 the compressed data CP concerning the compression determination region or the image data before the lossless compression concerning the compression determination region, the DRAM controller 112 outputs the compressed data CP and the image data before the lossless compression to the extension unit 114 and the selector 115.

As thus described, the reading address generating unit 111 and the DRAM controller 112 operate in cooperation with each other, to function as reading means for reading the data stored in the DRAM 50.

The flag storing unit 113 is configured by an SRAM, a resistor or the like, and stores the compression determination flag data CPF read from the DRAM 50.

The extension unit 114 extends the compressed data CP read from the DRAM 50, to generate image data concerning the compression determination region. As the extension technique, a technique corresponding to the lossless compression technique which was adopted at the time of the lossless compression is adopted. For example, the data compressed by use of the lossless compression technique is subjected to an extension process in a reverse procedure to the compression. Data after the extension is inputted into the selector 115.

The selector 115 selects and outputs either one data out of the data inputted from the extension unit 114 and the data inputted from the DRAM controller 112, based on the compression determination flag inputted from the flag storing unit 113. Specifically, when inputted with the determination flag "1" indicating that the lossless compression has been possible, the selector 115 outputs the data inputted from the extension unit 114. On the other hand, when inputted with the determination flag "0" indicating that the lossless compression has been impossible, the selector 115 outputs the data inputted from the DRAM controller 112.

Figure 12:
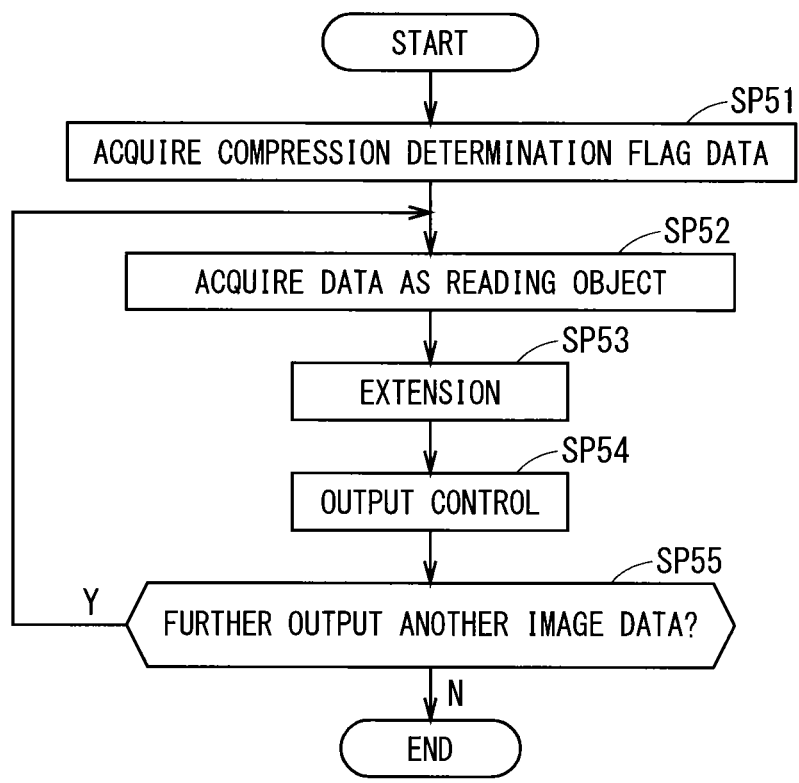
FIG. 12 is a flowchart of an operation of the data reading controlling device.

Here described will be an operation of the data reading controlling device 100 having the configuration as described above. FIG. 12 is a flowchart of the operation of the data reading controlling device 100.

As shown in FIG. 12, before the data concerning the image is read from the DRAM 50, the compression determination flag data CPF stored in the DRAM 50 is firstly acquired in Step SP51.

Specifically, the reading address generating unit 111 generates a reading address showing the storage location of the compression determination flag data CPF, and outputs the reading address to the DRAM controller 112. The DRAM controller 112 reads the compression determination flag data CPF from the DRAM 50 in accordance with the input of the reading address, and stores the compression determination flag data CPF into the flag storing unit 113.

In subsequent Step SP52, the compressed data CP concerning the image data as the reading object or the image data itself is read from the DRAM 50.

Specifically, the reading address generating unit 111 acquires from the flag storing unit 113 the compression determination flag concerning the compression determination region as the reading object, and specifies whether or not the image data concerning the compression determination region as the reading object is lossless-compressible. When the image data has been lossless-compressible, the reading address generating unit 111 generates a reading address for reading from the DRAM 50 the compressed data CP concerning the compression determination region as the reading object, and outputs the reading address to the DRAM controller 112. On the other hand, when the image data has been lossless-incompressible, the reading address generating unit 111 generates a reading address for reading from the DRAM 50 the image data concerning the compression determination region as the reading object, and outputs the reading address to the DRAM controller 112.

The DRAM controller 112 makes DRAM 50 output the compressed data CP concerning the compression determination region as the reading object or the image data concerning the compression determination region as the reading object, the compressed data CP and the image data being stored in the storage location designated by the reading address. The DRAM controller 112 then outputs to the extension unit 114 and the selector 115 the compressed data CP concerning the compression determination region as the reading object or the image data concerning the compression determination region as the reading object, the compressed data CP and the image data being outputted from the DRAM 50.

In Step SP53, extension of the compressed data CP concerning the compression determination region as the reading object is performed by the extension unit 114.

In Step SP54, output control of the image data is performed by the selector 115. Specifically, either one piece of data out of the data inputted from the extension unit 114 and the data inputted from the DRAM controller 112 is selected based on the compression determination flag, and the selected data is outputted as part of the block image data MB.

In Step SP55, it is determined whether or not to further output another image data. When another image data is to be further outputted, the operating process is shifted to Step SP52, and respective processes in Steps SP52 to Steps SP55 are repeatedly executed. On the other hand, when another image data is not to be outputted, the operating process is completed.

As described above, the data reading controlling device 100 is configured to be capable of reading storage data from the storage unit 5 which stores, as the storage data, the compression determination flag indicating whether or not the image data concerning the compression determination region in the image data MB in units of blocks has been lossless-compressible and either the compressed data CP concerning the compression determination region or the image data concerning the compression determination region. Then, the data reading controlling device 100 is provided with: the reading means for reading the storage data; the extension unit 114 capable of extending the compressed data CP included in the storage data; the selector 115 which outputs data after the extension when the compression determination flag indicating that the lossless compression has been possible is included in the storage data, and outputs the image data concerning the compression determination region included in the storage data when the compression determination flag indicating that the lossless compression has been impossible is included in the storage data.

According to the data reading controlling device 100 as thus described, it is possible to read data stored in the storage unit 5 by use of the data storage controlling device 1A, and sequentially output the image data MB in units of blocks in each compression determination region. It should be noted that, when the data amount of the image data included in the compression determination region is not larger than a data amount transferable by DMA transfer at one time, it is possible to sequentially DMA-transfer the image data sequentially outputted from the data reading controlling device 100.

[1-6. Applied Example]

Figure 13:
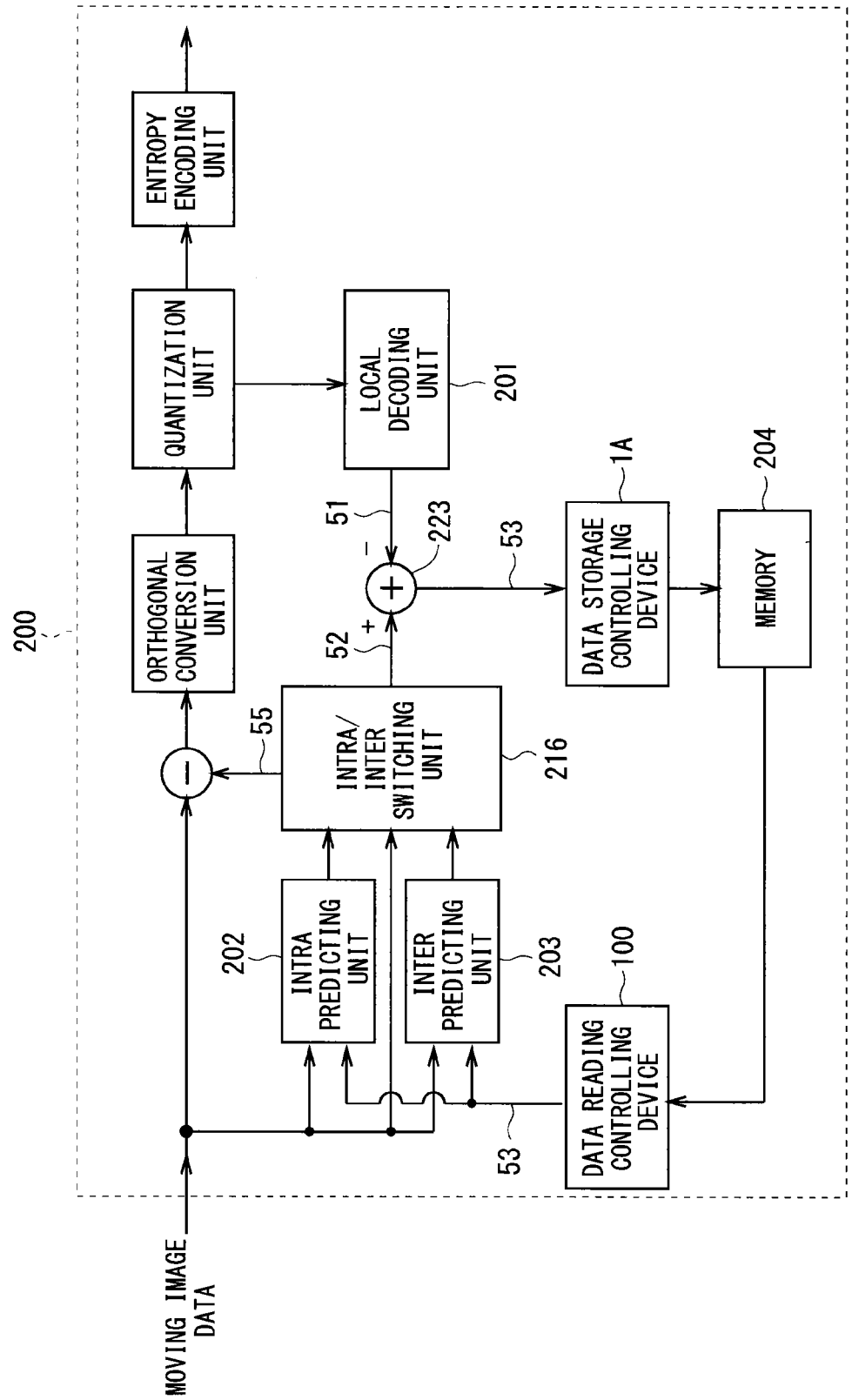
FIG. 13 is a diagram showing an applied example of a data storage controlling device and a data reading controlling device.

The foregoing data storage controlling device 1A and data reading controlling device 100 are used, for example, inside an encoding unit (encoder) for performing a compression process (encoding process) on moving image data in a moving image compression system such as H264, MPEG (Moving Picture Experts Group)-2 or MPEG-4. FIG. 13 is a diagram showing an applied example in the case of using the data storage controlling device 1A and the data reading controlling device 100 inside an encoding unit 200.

FIG. 13 shows an aspect where the data storage controlling device 1A is provided at an input of a memory 204 for storing a reference image 53 obtained by adding a residual error signal 51 outputted from a local decoding unit 201 that executes reversal quantization and reversal DCT and a predicted image 52 generated in an intra predicting unit 202 or an inter predicting unit 203, and the data reading controlling device 100 is provided at an output of the memory 204.

In the encoding unit 200 of FIG. 13, it is possible to reduce an amount of a bus used when data concerning the reference image is written into the memory 204 and read from the memory 204.

2. Second Preferred Embodiment

Next, a second preferred embodiment will be described. In a data storage controlling device 1B according to the second preferred embodiment, a compression condition for lossless compression is changed in accordance with complexity of an inputted image. It is to be noted that in the data storage controlling device 1B, portions in common with those in the data storage controlling device 1A of the first preferred embodiment are provided with the same numerals, and descriptions thereof are omitted.

In the data storage controlling device 1B according to the second preferred embodiment, the compression condition for lossless compression is changed in accordance with complexity of an inputted image. FIG. 14 is a block diagram showing a configuration of the data storage controlling device 1B according to the second preferred embodiment.

As shown in FIG. 14, the data storage controlling device 1B further has a complexity determining unit 15.

The data storage controlling device 1B is further provided with the complexity determining unit 15 in addition to the compression unit 11, the compression determination flag generating unit 12, the storage control unit 13 and the DRAM controller 14.

The image data inputted into the data storage controlling device 1B is inputted into the complexity determining unit 15, the compression unit 11 and the storage control unit 13, respectively.

The complexity determining unit 15 has the function of determining the complexity of the inputted image, to decide compression conditions.

Specifically, the complexity determining unit 15, for example, performs Hadamard transform on the inputted image, to acquire a frequency component of the image. The complexity determining unit 15 then compares the acquired frequency component with a determined reference value, to determine an image with a large number of low-frequency components as an image with low complexity and determine an image with a small number of low-frequency components (a large number of high-frequency components) as an image with high complexity.

As the compression conditions decided by the complexity determining unit 15, there exist a size of the compression object region, a value of the determined information amount for expressing the pixel value information, and a direction in which a difference in pixel value between adjacent pixels is calculated in the compression object region.

The size of the compression object region has an influence on the success rate for the lossless compression and the compression rate in the compression object region, and when the compression object region is made smaller, the success rate for the lossless compression in the compression object region increases, but the compression rate in each compression object region decreases.

Since a difference in pixel value between adjacent pixels is assumed to be large in the image with high complexity, it is preferable in the image with high complexity to make the compression object region smaller so as to increase the success rate for the lossless compression. On the other hand, since a difference in pixel value from an adjacent pixel is assumed to be small in the image with low complexity, it is preferable in the image with low complexity to make the compression object region larger so as to improve the compression rate in each compression object region.

Moreover, the value of the determined information amount for expressing the pixel value information has an influence on the success rate for the lossless compression and the compression rate in the compression object region, and when the value of the determined information amount is made larger, the success rate for the lossless compression in the compression object region increases but the compression rate in each compression object region decreases.

Since a difference in pixel value from an adjacent pixel is assumed to be large in the image with high complexity, it is preferable in the image with high complexity to make the value of the determined information amount larger so as to increase the success rate for the lossless compression. On the other hand, since a difference in pixel value from an adjacent pixel is assumed to be small in the image with low complexity, it is preferable in the image with low complexity to make the value of the determined information amount smaller so as to improve the compression rate in each compression object region.

Furthermore, the direction in which a difference in pixel value between adjacent pixels is calculated has an influence on the success rate for the lossless compression in the compression object region, and a direction in which the correlativity between the adjacent pixels is high in the image is preferably defined as a direction in which a difference in pixel value between adjacent pixels is calculated.

For this reason, the complexity determining unit 15 compares a frequency component in a horizontal direction and a frequency component in a vertical direction, and the direction in which the frequency component is smaller between the horizontal direction and the vertical direction is set as the direction in which a difference in pixel value between adjacent pixels is calculated.

The compression conditions decided based on the standard as described above are outputted to the compression unit 11 and the compression determination flag generating unit 12. The lossless compression in which the compression conditions inputted from the complexity determining unit 15 is reflected is performed in the compression unit 11. The compression determination flag generating unit 12 outputs the compression determination flag and information (compression condition information) concerning the compression conditions to the storage control unit 13. When the lossless compression is possible, the storage control unit 13 outputs to the DRAM controller 14 the compressed data concerning the compression determination region, the possibility determination flag and the compression condition information, and stores them into the DRAM 50.

As thus described, it is possible to perform the lossless compression on the compression conditions in accordance with the complexity of the image according to the data storage controlling device 1B, so as to increase the possibility for reducing the data amount by the compression.

In addition, the determination of the complexity by the complexity determining unit 15 may be performed with respect to each image or with respect to each block image.

3. Modified Example

Although the preferred embodiments have been described above, the present invention is not restricted to the contents described above.

For example, although the DRAM 50 has been exemplified as the storage unit 5 in each of the preferred embodiments above, the storage unit 5 may be an SRAM.

Moreover, although the region having the size of 4×1 pixels has been regarded as the compression object region in each of the above preferred embodiments, this is not restrictive. FIG. 15 is a diagram showing another aspect of the compression object region.

As shown in FIG. 15, the compression object region RS may be a region RS 10 having a size of 4×2 pixels or a region RS11 having a size of 1×4 pixels.

Figure 16:
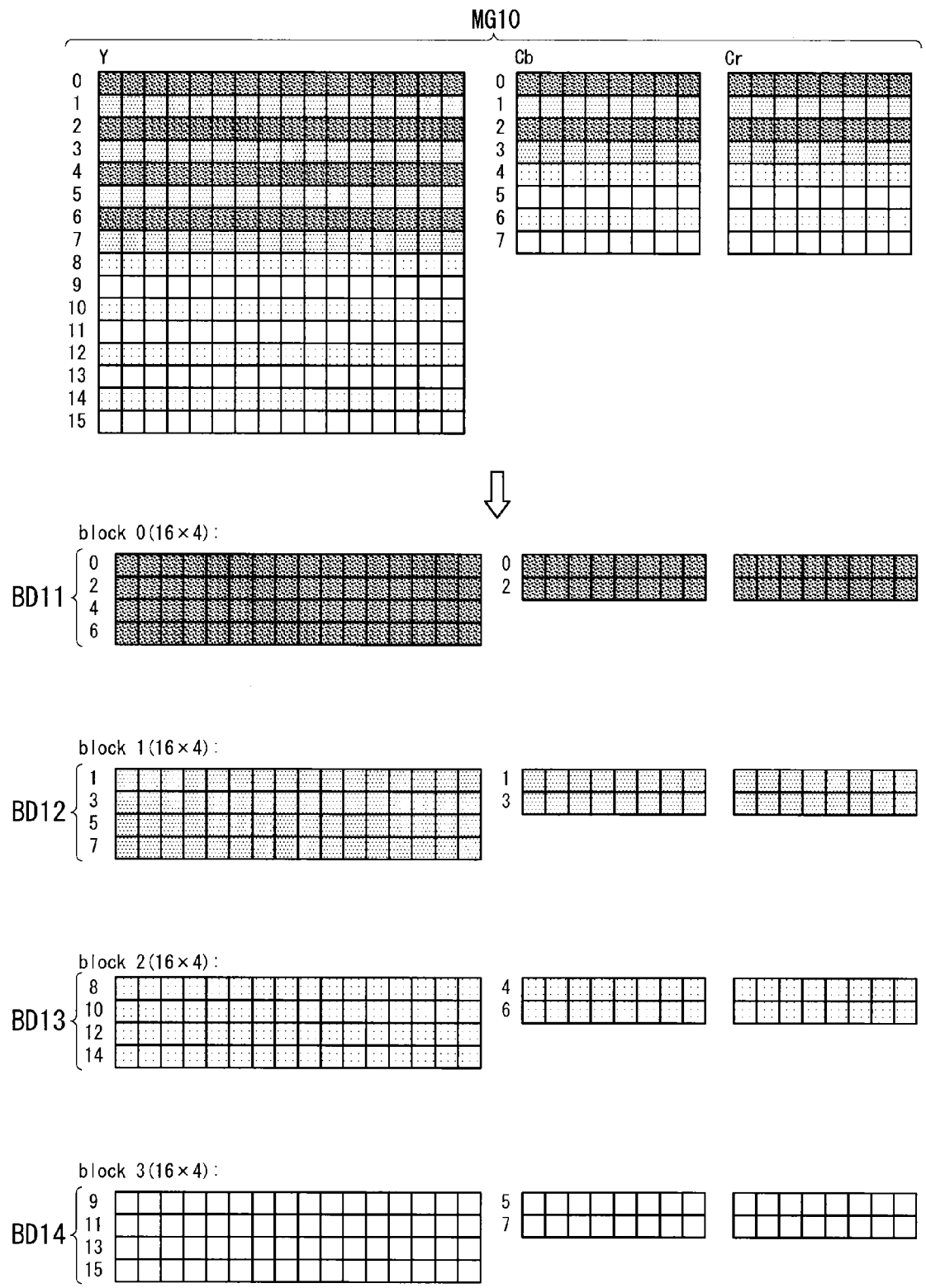
FIG. 16 is a schematic diagram of compression processing which is performed on a block image in YUV420 format.

Moreover, in the data storage controlling devices 1A and 1B of each of the above preferred embodiment, the aspect has been illustrated where the block image data MB is sequentially inputted into the data storage controlling devices 1A and 1B on each one line, but this is not restrictive. FIG. 16 is a schematic diagram of compression process which is performed on a block image MG10 in YUV420 format.

FIG. 16 shows an aspect where the block image MG10 of 16×16 pixels obtained by dividing a color image in YUV 420 format is inputted every other line into the data storage controlling device 1A (1B). That is, FIG. 16 shows an aspect where, firstly, image data BD11 on the zeroth, second, fourth and sixth lines are inputted; second, image data BD12 on the first, third, fifth and seventh lines are inputted; third, image data BD13 on the eighth, tenth, twelfth and fourteenth lines are inputted; and fourth, image data BD14 on the ninth, eleventh, thirteenth and fifteenth lines are inputted.

As thus described, when image data is inputted every other line, the correlativity of the pixel value between adjacent pixels in the vertical direction is low in the image data each time, and hence the direction in which a difference in pixel value between adjacent pixels is calculated in the compression object region may be the horizontal direction rather than the vertical direction. That is, the compression unit 11 may set the compression object region so as to include the pixels on the same line (in other words, so as not to include a pixel on a different line), and perform the lossless compression on the compression object region.

The size of the compression determination region is preferably such that the data amount of the image data included in the compression determination region is not larger than a data amount transferable by DMA transfer at one time, and when the size of the compression determination region is decided so as to satisfy such a setting standard, it is possible to sequentially perform the compression process on image data which are inputted into the data storage controlling devices 1A and 1B by the DMA transfer.

Moreover, although the case has been illustrated in the above preferred embodiments where the size of the block image data MG inputted into the data storage controlling devices 1A and 1B is 16×16 pixels, this is not restrictive. Specifically, the size of the block image may be an arbitrary size of N×☐M pixels (N and M are counting numbers) such as 4×4 pixels, 8×8 pixels and 8×16 numbers.

Moreover, although the data storage controlling devices 1A and 1B and the data reading controlling device 100 have been separately described in the above preferred embodiments, there may be an aspect where the data storage controlling device 1 and the data reading controlling device 100 are mounted inside the same apparatus.

While the invention has been shown and described in detail, the foregoing description is in all aspects illustrative and not restrictive. It is therefore understood that numerous modifications and variations can be devised without departing from the scope of the invention.

What is claimed is:

1. A data storage controlling device, comprising:
    circuitry configured to
    acquire frequency components of an image;
    determine a complexity of the image in accordance with the frequency components to decide a compression condition for lossless compression of the image;
    perform the lossless compression for reducing a data amount on each process region including a plurality of pixels in the image;
    determine whether or not said lossless compression is possible in each determination region including a plurality of process regions; and
    perform storage control in each determination region in such a manner that data after said lossless compression in a certain determination region is stored as compressed data into a storage circuit when said lossless compression in each process region included in the certain determination region is possible, and image data before said lossless compression in a certain determination region is stored into said storage circuit when said lossless compression in each process region included in the certain determination region is impossible;
    wherein the circuitry is configured to perform the lossless compression based on the compression condition decided in accordance with the complexity by setting at least one of a size of an information amount allotted in the storage circuit to each of the plurality of pixels and a direction in which a difference in pixel value between adjacent ones of the pixels is calculated.

2. The data storage controlling device according to claim 1, wherein
    each image data in units of blocks obtained by dividing said image is sequentially inputted into said circuitry in units of lines, and
    said circuitry performs said lossless compression on each sequentially inputted image data in units of blocks in each said process region.

3. The data storage controlling device according to claim 1, wherein said circuitry is configured to retrieve said compressed data and the image data before said lossless compression, such that start addresses showing a storage locations of said compressed data and the image data before said lossless compression stored in said storage circuit are provided at regular intervals with respect to respective determination regions.

4. The data storage controlling device according to claim 1, wherein
    said circuitry is further configured to
    set a reference pixel out of a plurality of pixels included in each said process region,
    calculate the difference in pixel value from an adjacent pixel with respect to each normal pixel in said process region, a normal pixel being defined as any pixel that is not the reference pixel, such that a pixel value of each normal pixel is specified from a pixel value of the reference pixel, and
    express the difference in pixel value calculated with respect to each said normal pixel by the number of bits which is smaller than the number of bits expressing the pixel value of said reference pixel, thereby converting the data amount in each said process region.

5. The data storage controlling device according to claim 4, wherein said circuitry is configured to determine that lossless compression in the determination region is possible when a difference in pixel value at each normal pixel in each process region included in said determination region can all be expressed by said number of bits which is smaller.

6. The data storage controlling device according to claim 1, wherein
    each image data in units of blocks obtained by dividing said image is sequentially inputted into said circuitry every other line, and
    said circuitry is configured to set each said process region so as to include a plurality of pixels on the same line, to perform said lossless compression on each said process region.

7. A data reading controlling device that reads storage data from a storage circuit that stores, as said storage data, either compressed data concerning image data in a determined region of an image which is stored when lossless compression of the image data in said determined region is possible or the image data in said determined region which is stored when said lossless compression is impossible, and a compression determination flag indicating whether or not said lossless compression has been possible,
    said device comprising circuitry configured to
    read said storage data;
    extend said compressed data included in said storage data by taking into account a way in which the lossless compression was performed based on a compression condition decided in accordance with a complexity of the image determined in accordance with frequency components of the image by setting at least one of a size of an information amount allotted in the storage circuit to each of a plurality of pixels in the image and a direction in which a difference in pixel value between adjacent ones of the pixels is calculated; and
    output data after extension when said compression determination flag indicating that said lossless compression of the image data in said determined region has been possible is included in said storage data, and output the image data in said determined region included in said storage data when said compression determination flag indicating that said lossless compression of the image data in said determined region has been impossible is included in said storage data.

8. A data storing method, comprising the steps of:
    acquiring frequency components of an image;
    determining a complexity of the image in accordance with the frequency components to decide a compression condition for lossless compression of the image;

performing the lossless compression for reducing a data amount in each process region including a plurality of pixels in the image, the lossless compression being performed based on the compression condition decided in accordance with the complexity by setting at least one of a size of an information amount allotted in a storage circuit to each of the plurality of pixels and a direction in which a difference in pixel value between adjacent ones of the pixels is calculated;

determining whether or not said lossless compression is possible in each determination region including a plurality of process regions; and storing, as compressed data, data after said lossless compression in a certain determination region into the storage circuit when said lossless compression is possible concerning the certain determination region, and storing image data before said lossless compression in said certain determination region into said storage circuit when said lossless compression is impossible concerning the certain determination region.

* * * * *